United States Patent
Huang et al.

(10) Patent No.: US 8,791,724 B1
(45) Date of Patent: Jul. 29, 2014

(54) POST DRIVER FOR HIGH DENSITY INTEGRATED CIRCUITS

(71) Applicant: Taiwan Semiconductor Manufacturing Co., Ltd., Hsin-Chu (TW)

(72) Inventors: Tien-Chien Huang, Hsinchu (TW); Ruey-Bin Sheen, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/778,380

(22) Filed: Feb. 27, 2013

(51) Int. Cl.
*H03K 3/00* (2006.01)

(52) U.S. Cl.
USPC .......................................... 327/108; 326/83

(58) Field of Classification Search
USPC ............... 327/108–112, 180, 309, 312, 321; 326/82, 83, 87, 88
See application file for complete search history.

(56) References Cited

U.S. PATENT DOCUMENTS

| | | | |
|---|---|---|---|
| 6,578,185 B1 * | 6/2003 | Kelly | 716/126 |
| 6,628,149 B2 * | 9/2003 | Ajit | 327/108 |
| 7,375,555 B1 * | 5/2008 | Wang et al. | 326/81 |
| 7,733,159 B1 * | 6/2010 | Camarota et al. | 327/534 |
| 8,115,533 B2 | 2/2012 | Kim | |
| 8,169,234 B1 | 5/2012 | Bourstein | |
| 8,183,884 B2 | 5/2012 | Jung | |
| 8,217,685 B2 * | 7/2012 | Scott et al. | 327/108 |
| 8,493,122 B1 * | 7/2013 | Chaudhry et al. | 327/318 |
| 2002/0017940 A1 * | 2/2002 | Fujii et al. | 327/319 |
| 2011/0298494 A1 * | 12/2011 | Bringivijayaraghavan et al. | 326/87 |
| 2013/0169339 A1 | 7/2013 | Chen | |

OTHER PUBLICATIONS

"Wide I/O Single Data Rate (Wide I/O SDR)", Published by Jedec Solid State Technology Association, Arlington, VA, Dec. 2011, 74 pages.

* cited by examiner

*Primary Examiner* — William Hernandez
(74) *Attorney, Agent, or Firm* — Duane Morris LLP

(57) ABSTRACT

A post driver implemented using core device transistors to drive an output connection between the high and low voltage levels of an I/O voltage range. The post driver is made from a plurality of core devices operable within a core voltage range that is less than the I/O voltage range. The plurality of core devices is cascaded between upper and lower power connections set to the full I/O voltage range. The post driver has a voltage clamping element, such as a diode, having a predefined threshold voltage and connected to the core devices so as to maintain the voltage difference across the terminals thereof within the core voltage range.

19 Claims, 5 Drawing Sheets

POST DRIVER FOR HIGH DENSITY INTEGRATED CIRCUITS

FIELD

This disclosure relates to circuits generally, and more specifically to post drivers used with a high density integrated circuit such as a system-on-a-chip ("SOC") and/or a 3D integrated circuit ("3D IC").

BACKGROUND

In various high density integrated circuit contexts, some components, such as analog or radiofrequency ("RF") circuits are not located on a main die of the integrated circuit, sometimes designated a SOC main die. Typically, there are only high speed digital circuits on a SOC main die, such as standard cell, SRAM, digital PLL, and high speed memory input/output ("I/O"). Core devices are devices that are formed on such a die to provide high speed digital circuits, and generally operate faster, use lower voltages, have higher density, and are more susceptible to being overstressed and damaged.

I/O needs of a system typically deal with transferring signals between integrated circuit dies and component connections having large capacitances, such as those associated with printed circuit board traces, cables etc. that require larger driving power and voltage than the signaling occurring within the integrated circuit die. I/O devices interface the faster, smaller signals of a main die to these other, higher capacitance components, and typically transfer the signals at higher voltages.

The semiconductor standards body JEDEC provides at least two specifications pertaining to I/O for 3D IC applications, namely Wide I/O and Wide I/O 2, which are generally referred to herein collectively as Wide I/O. The Wide I/O specifications are directed to wide I/O applications having SDRAM (monolithic density) devices with thousands of wide I/O channels using direct chip-to-chip attachment methods between memory devices and a controller device. In Wide I/O, the power supply for data input/output buffers is specified at 1.2 V±5%. Core devices on a typical main die, however, operate at a lower voltage, for example, 0.9 V and may be overstressed if operated at the I/O voltage level.

In various contexts, there is a need to provide a post driver for the I/O demands of high density integrated circuits, such as those found in SOC and 3D IC applications.

BRIEF DESCRIPTION OF THE DRAWINGS

The following will be apparent from elements of the figures, which are provided for illustrative purposes and are not necessarily to scale.

DETAILED DESCRIPTION

Figure 1:
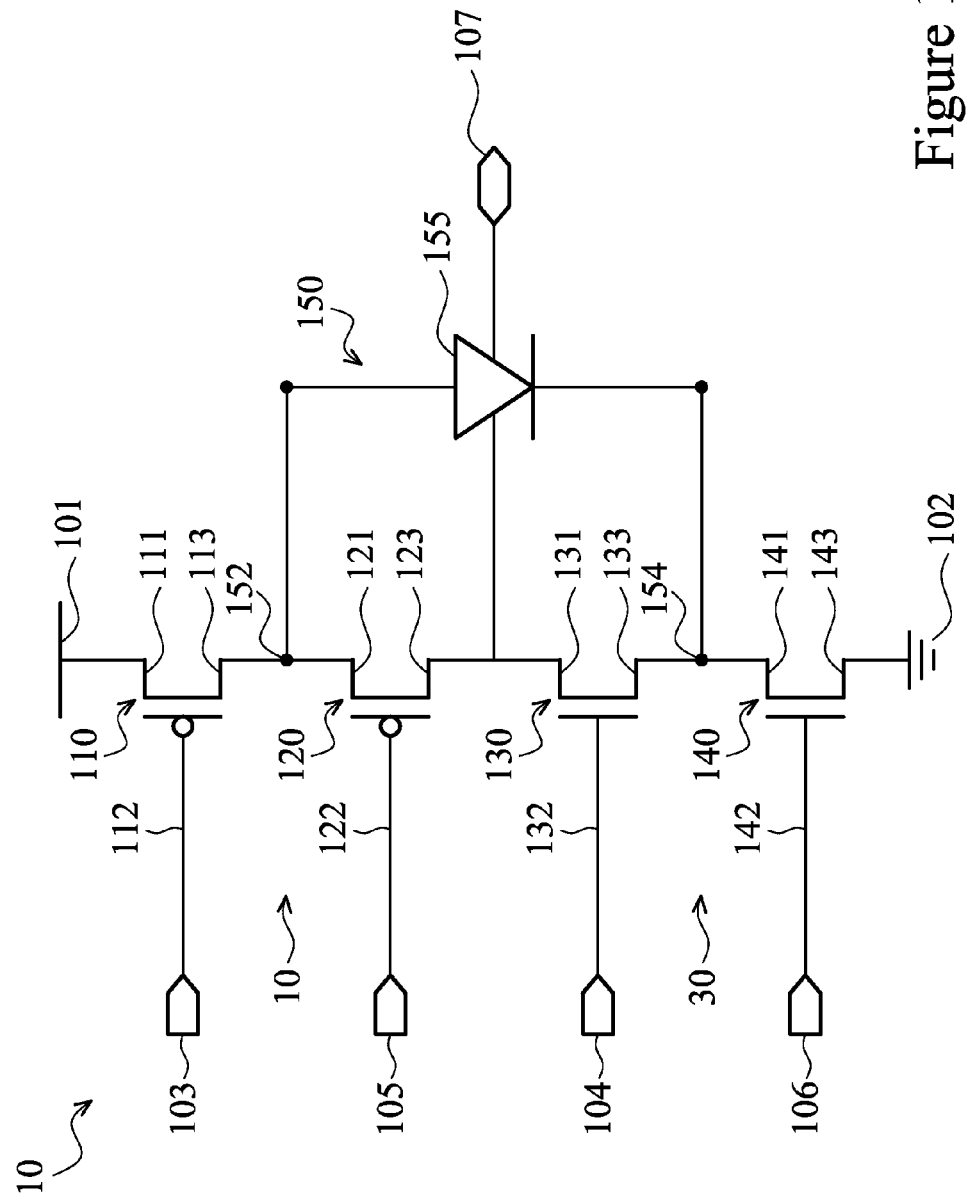
FIG. 1 is a diagram of a post driver implemented using core device MOSFETs.

This description of certain exemplary embodiments is intended to be read in connection with the accompanying drawings, which are to be considered part of the entire written description. Terms and depictions concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms and depictions concerning electrical coupling and the like, such as "coupled," "connected" and "interconnected," refer to a relationship wherein structures communicate with one another either directly or indirectly through intervening structures unless expressly described otherwise. Similarly, terms and depictions concerning connection points in a circuit such as "pad", "rail", or "terminal" should be understood as inclusive of all forms of electronic connection and are not limited to a physically identifiable pad, rail, or terminal unless expressly described otherwise.

In various embodiments, the core devices may be implemented as part of a foundry process specified for a specific size and transistor density. For example, the current assignee has developed a method of manufacturing high density integrated circuits at 28 nm, which delivers approximately twice the gate density of prior 40 nm processes. In the 28 nm process family, there are currently four main processes: low power (LP), high performance (HP), a low power with high-k metal gates (HPL), and high performance for mobile applications (HPM). The N28HPM process family is suitable for applications such as networking, tablets, and mobile consumer products.

Each of the processes mentioned have a core voltage (Vdd) different to the typical I/O voltage (Vddq). For example, currently the core voltage in the standard offerings are 0.85 V (HP), 0.9 V (HPM), 1.0 V (HPL), and 1.05 V (LP). Typical I/O voltages for these processes are higher. For example, in some embodiments the I/O voltage is 1.8 V I/O and includes under and over drive variations, for example 1.8 V UD 1.2 V, 1.8 V UD 1.5 V. In other embodiments, the I/O voltage is 2.5 V I/O and includes under and overdrive variations such as 2.5 V UD 1.8 V, 2.5 V OD 3.3 V. In further embodiments, the I/O voltage is the 1.2V±5% specified by JEDEC in the Wide I/O or Wide I/O 2 standards. The core and I/O voltages stated in this disclosure are exemplary in nature, and other voltages are contemplated within the scope of the disclosure, both at the 28 nm design level and at other design levels. For example, 20 nm process families are in development and smaller families are contemplated, with anticipated smaller Vdd.

In some embodiments, the disclosed post driver is implemented and modeled using core devices of the HPM process of the 28 nm foundry generation, designated N28HPM. The core devices for the HPM process operate over a core voltage range, specified with a high voltage level of Vdd at 0.9 V±10% and a low voltage level of Vss at a ground of 0 V.

FIG. 1 is a diagram of a post driver 100 implemented using core device MOSFETs in accordance with some embodiments. In this example, the post driver 100 is designed as a core device on the N28HPM (not shown), operating with core voltages of Vdd at 0.9 V±10% and Vss at a ground of 0 V. Post driver 100 receives power from a first power connection, Vddq rail 101, that supplies power at 1.2 V±5%. Post driver 100 is connected to a second power connection, Vssq rail 102, at a ground of 0 V. In various alternative embodiments, Vss and Vssq may be at true ground, 0 V, a common reference voltage, or at different reference voltages.

A first input connection 103, P-Input, is coupled to the gate terminal 112 of PMOS transistor 110, which is one of a first pair of transistors 10. PMOS transistor 110 is designated MPT and has gate terminal 112, source terminal 111 and drain terminal 113. A second input connection 105, P-Input M, is coupled to the gate terminal 122 of PMOS transistor 120, which is the other transistor in the first pair of transistors 10. PMOS transistor 120 is designated MP and has gate terminal 122, source terminal 121 and drain terminal 123. The first pair of transistors 10 are core device PMOS devices connected in cascade between Vddq rail 101 and output pad 107. More specifically, PMOS transistor 110 and PMOS transistor 120 are connected to each other at first intermediate node 152. Source terminal 111 is connected to Vddq rail 101. Drain terminal 123 is connected to output pad 107. Drain terminal 113 is connected to source terminal 121 at first intermediate node 152. The voltage at first intermediate node 152 is designated Vou 522.

A third input connection 104, N-Input M, is coupled to the gate terminal 132 of NMOS transistor 130, which is one of a second pair of transistors 30. A fourth input connection 106 is coupled to the gate terminal 142 of NMOS transistor 130, which is the other transistor in the second pair of transistors 30. NMOS transistor 130 is designated MN and has gate terminal 132, drain terminal 131 and source terminal 133. NMOS transistor 140 is designated MNT and has gate terminal 142, drain terminal 141 and source terminal 143. The transistors are core device NMOS devices connected in cascade between the output pad 107 and Vssq rail 102. More specifically, NMOS transistor 130 and NMOS transistor 140 are connected to each other at second intermediate node 154. Drain terminal 131 is connected to output pad 107. Source terminal 133 is connected to drain terminal 141 at second intermediate node 154. The voltage at second intermediate node 154 is designated Vod 544.

Output pad 107 serves as an output connection for providing output voltage Vout 77 within an I/O voltage range. In this example, the I/O voltage is defined with a high voltage of 1.2 V±5% and a low voltage of ground. The I/O voltage of 1.2 V±5% is greater than the core voltage range discussed previously, and if the full 1.2 V±5% were to be applied across one of the core device transistors, the transistors would be overstressed, decreasing reliability and potentially resulting in failed operation and permanent damage.

Post driver 100 includes a voltage clamping element 150 connecting first intermediate node 152 to second intermediate node 154. The voltage clamping element 150 includes diode 155. Diode 155 has a threshold voltage, Vth, that is selected to be greater than the difference between the I/O voltage range and the core voltage range. Depending on the process used, Vth is typically between 0.5 V and 0.3 V. In some embodiments, Vth is greater than 1.2V 5% (i.e. 1.26V) less the lowest expected value of Vdd (i.e. 0.9 V–10%, or 0.81 V). Given the tolerances of Vssq and Vdd, diode 155 is selected having a Vth of at least 0.45 V.

In operation, first input connection 103, P-Input, shown in FIG. 1 receives a voltage signal P-Input 33. P-Input 33 has a high voltage Vddq, which, in this embodiment, is 1.2V±5%, and a low voltage of Vth above ground Vssq. Second input connection 105, P-Input M, receives voltage signal P-Input M 55. P-Input M 55 has a high voltage Vdd, which, in this embodiment, is 0.9 V±10%, and a low voltage of Vth above ground Vssq. Third input connection 104 receives voltage signal N-Input M 44. N-Input M 44 has a high voltage Vdd and a low voltage of Vth above ground Vssq. Fourth input connection 106, N-Input, receives voltage signal N-Input 66. N-Input 66 has a high voltage Vdd and a low voltage of ground Vssq.

Figure 2:
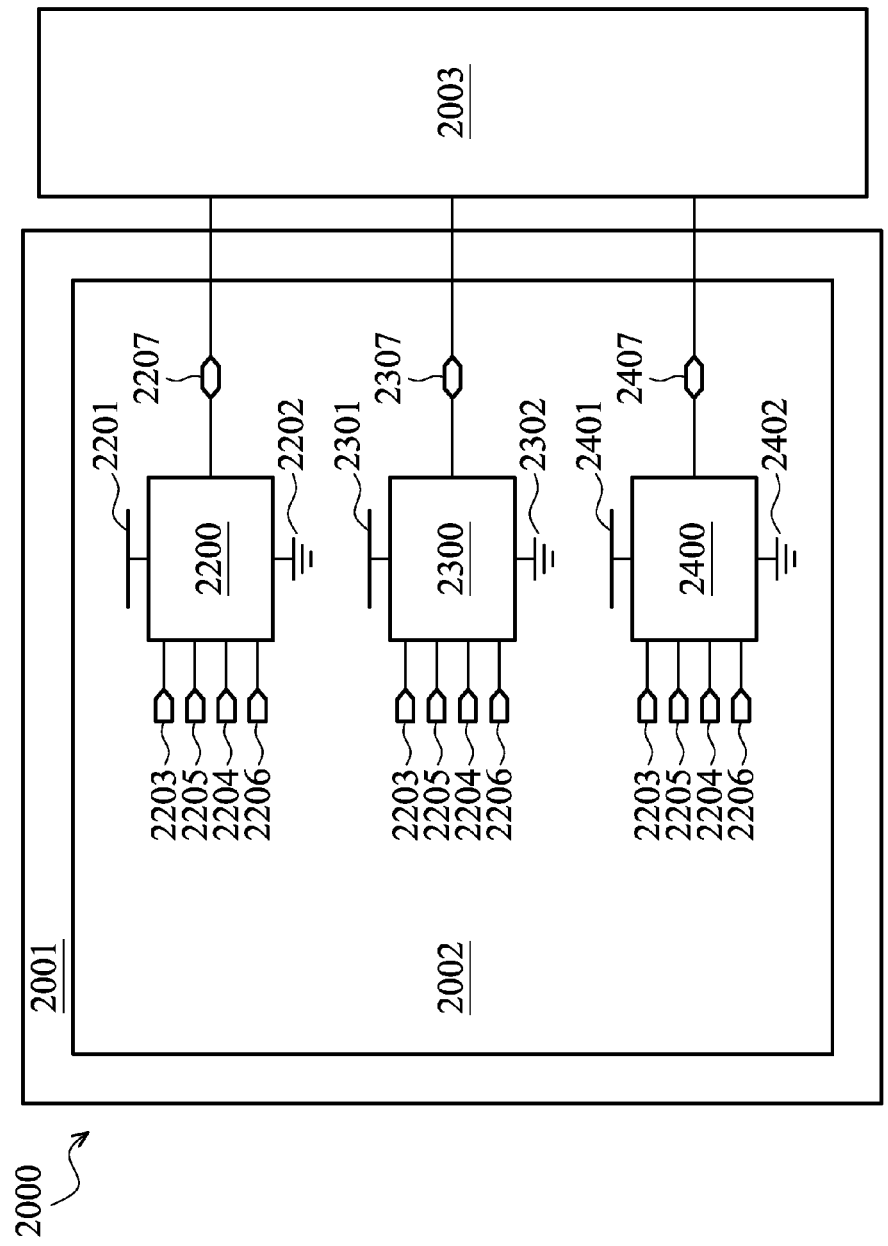
FIG. 2 is a diagram of a system using a plurality of the post driver shown in FIG. 1.

FIG. 2 is a diagram of an electronic system 2000 having integrated circuit silicon die 2001 and an off-core circuit 2003 disposed off of the integrated circuit silicon die 2001. Electronic system 2000 has a core circuit 2002 disposed on the integrated circuit silicon die 2001 and includes a plurality of core devices operating with core voltages Vdd and Vss, as described with respect to FIG. 1.

The core devices include a plurality of post drivers 2200, 2300, 2400. Post driver 2200 has first, second, third and fourth input connections 2203, 2205, 2204, and 2206, respectively. Post driver 2200 is connected to Vddq 2201, and Vssq 2202. Post drivers 2300 and 2400 have similar connections using similar reference numerals. The internal components of each of the post drivers 2200, 2300, 2400 are as shown and described with respect to FIG. 1. Three post drivers are shown in FIG. 2 for illustrative purposes only. In actuality, system 2000 has an extensive array of post drivers, not shown for practical purposes. The post drivers couple the core circuit 2002 to the off core circuit 2003.

Figure 3:
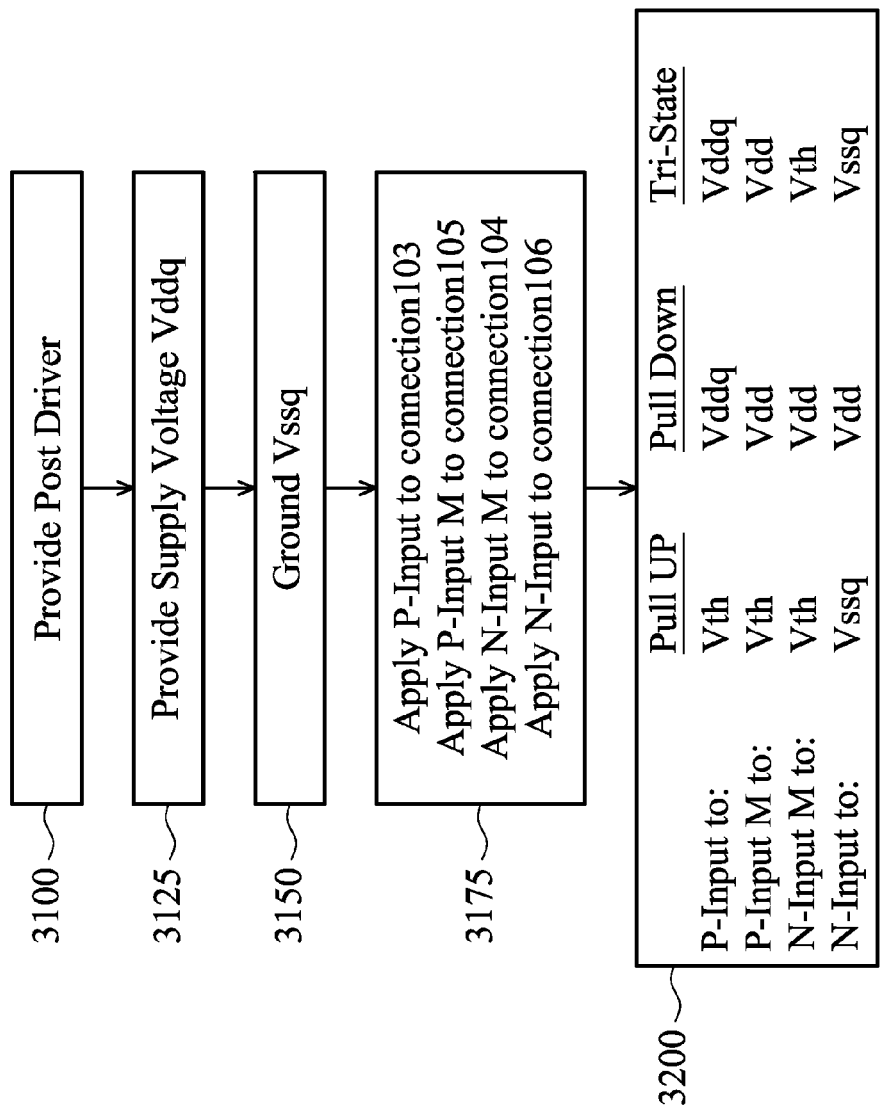
FIG. 3 is a flow diagram showing operation of the post driver shown in FIG. 1.

FIG. 3 is a flow diagram showing operation of post driver 100 shown in FIG. 1. In step 3100, post driver 100 is provided as shown and described with respect to FIG. 1. In step 3125, a high voltage of 1.2 V±5% is supplied to the Vddq rail 101. In step 3150, Vssq rail 102 is connected to ground. In step 3175, the following four voltage signals are applied to Post driver 100. P-Input voltage signal 33 is applied to first connection 103, the voltage signal having a high level of Vddq and a low level of Vth above Vssq. P-Input M voltage signal 55 is applied to second input connection 105, the voltage signal having a high voltage Vdd and a low voltage of Vth above Vssq. N-Input M voltage signal 44 is applied to third input connection 104, the voltage signal having a high voltage Vdd and a low voltage of Vth above Vssq. N-Input voltage signal 66 is applied to fourth input connection 106, the voltage signal 66 having a high voltage Vdd and a low voltage of Vssq. These respective high and low levels of the four input voltages advantageously prevent the voltage drop from the gate terminal of each MOS core device to one of that devices other terminals from exceeding the permissible core operating voltage during operation of the post driver.

In step 3200, the voltage output Vout 77 on the output pad 107 of post driver 100 is pulled up, pulled down, or driven to the tri-state, by selectively applying appropriate input voltage signals 33, 55, 44, and 66 as will be described further with reference to FIGS. 4 and 5. Output voltage at pad 107 is pulled up to Vddq (1.2 V±5%) when P-Input 33, P-Input M 55, and N-Input M 44 are all driven low to Vth above Vssq, and N-Input 66 is driven low to Vssq. Output voltage Vout 77 at pad 107 is pulled down to Vssq when P-Input 33 is driven high to Vddq and P-Input M 55, N-Input M 44, and N-Input 66 are all driven high to Vdd. Output voltage Vout 77 at pad 107 remains at either Vddq or Vssq when post driver 100 is put in a tri-state by driving P-Input 33 high to Vddq, driving P-Input M 55 high to Vdd, driving N-Input M low to Vth above Vssq, and driving N-Input 66 low to Vssq.

Figure 4:
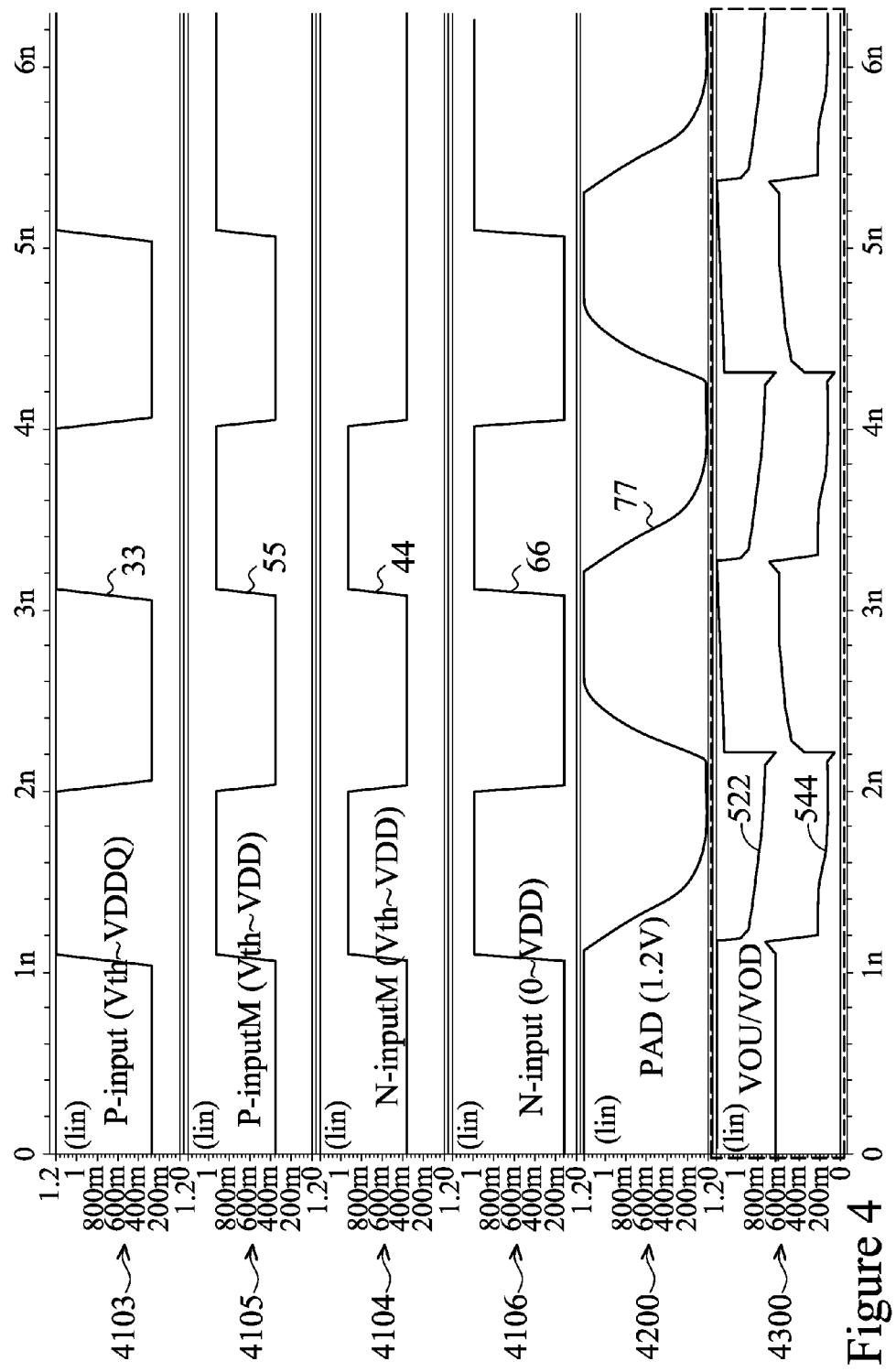
FIG. 4 shows waveforms of pull-up and pull-down events during the operation of the post driver shown in FIG. 1.
Figure 5:
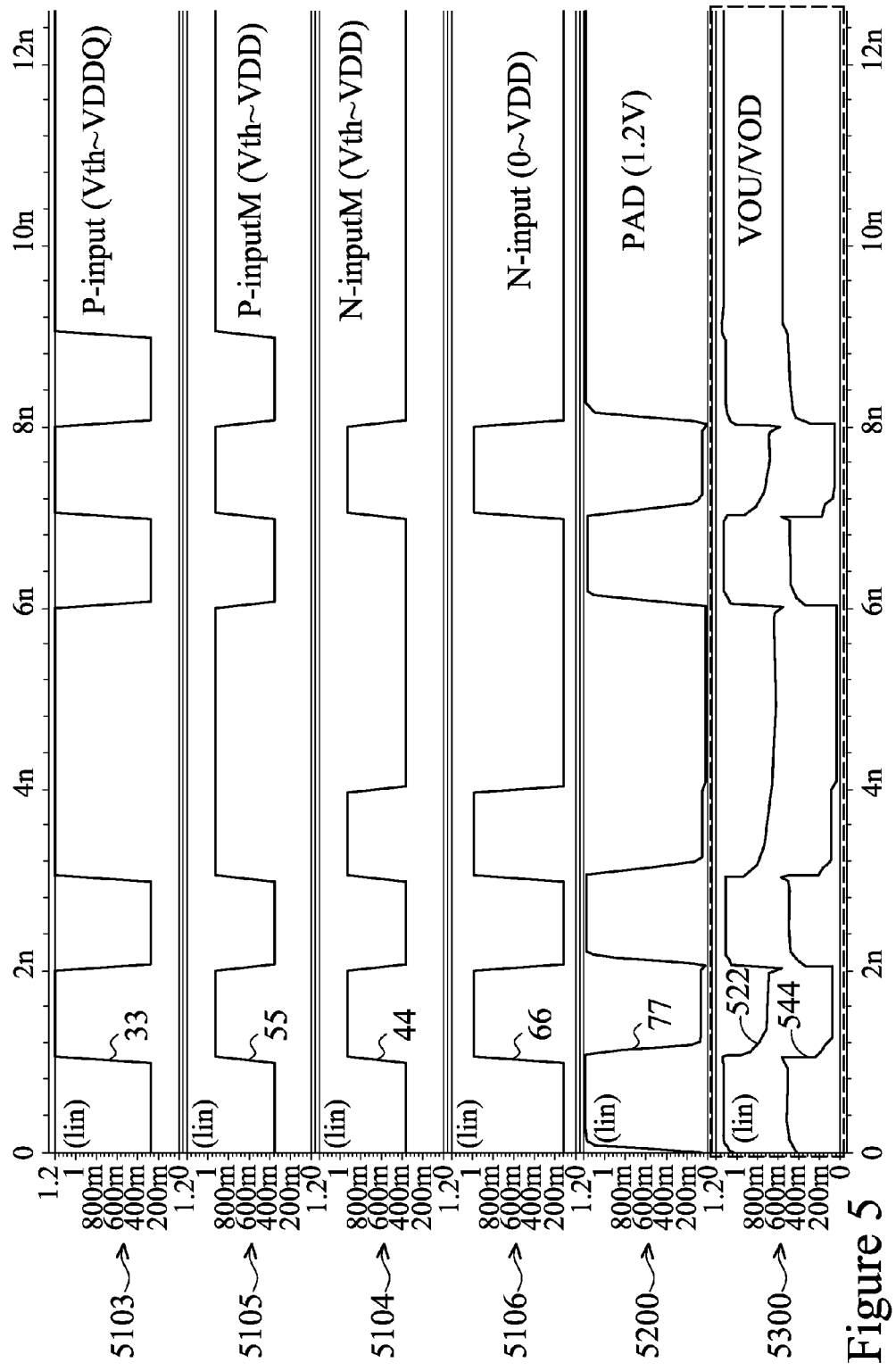
FIG. 5 shows waveforms of the tri-state operation of the post driver shown in FIG. 1.

FIGS. 4 and 5 show simulated waveforms of post driver 100 operation. The waveforms are shown with amplitude in volts and millivolts (as indicated) as a function of time in nanoseconds. FIG. 4 depicts pull-up and pull-down events during the operation of post driver 100 shown in FIG. 1. Graph 4103 of FIG. 4 shows input waveform P-Input 33. Graph 4105 shows input waveform for P-Input M 55. Graph 4104 shows input waveform for N-Input M 44. Graph 4106 shows input waveform for N-Input 66. Graph 4200 shows Vout 77 waveform at pad 107 resulting from the input waveforms shown in graphs 4103 to 4106. Graph 4300 shows voltage Vou 522 waveform at first intermediate node 152 and voltage Vod 544 waveform at second intermediate node 154 resulting from the input waveforms shown in graphs 4103 to 4106.

A pull down event will be described first, with reference to FIGS. 1 and 4. FIG. 4 shows multiple pull down events, for example, the events beginning at approximately 1 ns and 3 ns. Output voltage Vout 77 at pad 107 is pulled down to Vssq when P-Input 33 is driven high to Vddq and P-Input M 55, N-Input M 44, and N-Input 66 are all driven high to Vdd. During operation, diode 155 constrains the voltage difference between Vou 522 and Vod 544 to less than or equal to Vth, as shown in graph 4300, due to the normal function and characteristics of a diode. PMOS core device 120 (MP) and NMOS core device 130 (MN) are in parallel with the voltage clamping element 150 between intermediate nodes 152, 154. Thus, the voltage across PMOS core device 120 (MP) and NMOS core device 130 (MN) is given by Vou 522 minus Vod 544, i.e. Vth.

In the pull down event, all gate terminals (112, 122, 132 and 142) are driven to their respective high levels. Both NMOS core devices 130, 140 turn on, and both PMOS core devices 110, 120 turn off. Due to the second pair of transistors 30 being on, Vout 77 at pad 107 is pulled low to Vssq. Referring to the parallel circuit between intermediate nodes 152 and 154, NMOS core device 130 transitions on, but PMOS core device 120 has transitioned off. As a result, the effective resistance Reff of PMOS core device 120 is much larger than that of NMOS core device 130, and thus, nearly all of the voltage drop between Vou 522 and Vod 544 will occur across the off PMOS core device 120. As such, the voltage difference between PMOS core device 120's source terminal 121 and drain terminal 123 is constrained to approximately the threshold voltage Vth of diode 155. Diode 155 is selected with a Vth that is within the permissible voltage drop across PMOS core device 120.

Likewise, the voltage difference between source terminal 111 and drain terminal 113 of PMOS core device 110 (MPT) will be constrained to approximately Vddq minus the Vth of diode 155 above Vssq. The diode is selected with a Vth such that Vddq minus Vth gives a permissible voltage drop across PMOS core device 110. PMOS core device 110 (MPT) will not be overstressed so long as Vddq minus Vth is within the permissible operating range of the PMOS core device 110. The maximum voltage drop across any two terminals of the MOS transistors during the pull down event is thus Vddq to Vth above Vssq, or Vdd to Vssq, and both of these voltage drops are within the operating voltage range of the core devices, avoiding overstress. In some alternative embodiments, this relationship is maintained for a given diode Vth, a given I/O voltage range and a given permissible voltage drop across the core devices used to make the post driver. Stated differently, alternative embodiments can be adapted such that a given core devices' maximum operating voltage, plus threshold voltage of the clamping element, is more than the I/O voltage range.

Without the voltage clamping element, voltage Vou 522 at source terminal 121 may float as high as Vddq and as low as Vssq, when the PMOS core devices 110 and 120 are in the off state. With Vou 522 at Vddq, for example, and the second pair of transistors 30 turned on, drain terminal 123 would be connected to Vssq, causing an overstress of at least PMOS core device 120. Were Vou 522 at Vssq, source terminal 111 would be connected to Vddq, causing an overstress of at least PMOS core device 110. Voltage clamping element 150 advantageously prevents overstressing of the core devices. As depicted in graph 4300, the modeled waveforms Vou 522 and Vod 544 for post driver 100 correlate to each other, with the voltage difference being constrained to approximately Vth. As such, the model depicted in FIG. 4 indicates that post driver 100 will not overstress MOS core devices 110, 120, 130 and 140 during a pull down event even though post driver is using I/O voltages outside of the operating range of the core devices.

A pull up event will now be described with reference to FIGS. 1 and 4. The description of the pull up event is similar to the pull down event described previously, and therefore will not be repeated fully here for brevity. FIG. 4 shows multiple pull up events, for example, the events beginning at approximately 2 ns and 4 ns. Output voltage at pad 107 is pulled up to Vddq when P-Input 33, P-Input M 55 and N-Input M 44 are all driven low to Vth above Vssq and N-Input 66 is driven low to Vssq. In the pull up event, the PMOS core devices 110, 120 turn on, and NMOS core devices 130, 140 turn off.

To turn on the PMOS core devices 110, 120, P-Input 33 and P-Input M 55 are set to a low voltage level of approximately Vth of diode 155 above Vssq. Setting P-Input 33 and P-Input M 55 lower, for example to Vssq, could cause an overstress event across the corresponding PMOS core device gate terminals 112, 122. Due to the PMOS core devices 110, 120 being on, Vou 522, and Vout 77 are all pulled to Vddq. For the reasons described with respect to the pull down event, after a pull up event, the voltage difference across NMOS core device 130 will be constrained to Vth. Vod 544 will be Vddq minus Vth, making the voltage difference across the drain terminal 141 and source terminal 143 of NMOS core device 140 be constrained to Vddq minus Vth. As depicted in graph 4300, the modeled waveforms Vou 522 and Vod 544 for post driver 100 correlate to each other, with the voltage difference being constrained to approximately Vth. As such, the model depicted in FIG. 4 indicates that post driver 100 will not overstress MOS core devices 110, 120, 130 and 140 during a pull up event even though post driver is using I/O voltages outside of the operating range of the core devices. As with the pull down event, during the pull up event, the maximum voltage drop across any two terminals of the MOS transistors is Vddq to Vth above Vssq, or Vdd to Vssq, and both of these voltage drops are within the operating voltage range of the core devices, avoiding overstress.

A tri-state (hi impedance) event for turning off post driver 100 will now be described with reference to FIGS. 1 and 5. FIG. 5 shows waveforms of the tri-state operation of post driver 100 shown in FIG. 1. Graphs 5103, 5105, 5104 and 5106 of FIG. 5 show input waveforms P-Input 33, P-Input M 55, N-Input M 44, and N-Input 66, respectively. Graph 5200 shows Vout 77 waveform at pad 107 resulting from the input waveforms shown in graphs 5103 to 5106. Graph 5300 shows voltage Vou 522 waveform at first intermediate node 152 and voltage Vod 544 waveform at second intermediate node 154 resulting from the input waveforms shown in graphs 5103 to 5106.

As shown at approximately 4 ns in FIG. 5, the post driver 100 is turned off and put into a high impedance, tri-state with Vout 77 remaining low at Vssq. As shown in graphs 5103 to 5106, to initiate the tri-state event, P-Input 33 and P-Input M 55 were kept at their high levels of Vddq and Vdd, respectively, while N-Input M 44 and N-Input 66 were transitioned to their low levels of Vth above Vssq, and Vssq, respectively. As shown at approximately 9 ns, post driver 100 is turned off and put into the tri-state again, but with Vout 77 remaining high at Vddq. As shown in graphs 5103 to 5106, to initiate the tri-state event, N-Input M 44 and N-Input 66 remained low at Vth above Vssq, and Vssq, respectively, while P-Input 33 and P-Input M 55 were transitioned high to Vddq and Vdd, respectively.

With the P-Inputs high and the N-Inputs low, each of the four MOS core devices 110, 120, 130 and 140 is in the cutoff region due to the minimal voltage difference between the respective gate and source terminals. In this state, diode 155 will clamp the voltage between Vou 522 and Vod 544 to about Vth above Vssq, making Vth the maximum voltage drop across MOS core devices 120, 130, individually and together. Likewise, for each of PMOS core device 110 (MPT) and NMOS core device 140 (MNT), the Voltage difference from the source terminal to the drain terminal will be less than or equal to Vddq minus Vth. As depicted in graph 5300, the modeled waveforms Vou 522 and Vod 544 for post driver 100 correlate to each other, with the voltage difference being constrained to approximately Vth. As such, the model depicted in FIG. 5 indicates that post driver 100 will not overstress MOS core devices 110, 120, 130 and 140 when placed into the tri-state, even though post driver is using I/O voltages outside of the operating range of the core devices. As with the pull down and pull up events, during the tri state events, the maximum voltage drop across any two terminals of the MOS transistors is Vddq to Vth above Vssq, or Vdd to Vssq, and both of these voltage drops are within the operating voltage range of the core devices, avoiding overstress.

Thus, in accordance with the description above, and the corresponding modeled waveforms shown in FIGS. 4 and 5, post driver 100 may be pulled up, pulled down, and turned off into the tri-state as described without overstressing MOS core devices 110, 120, 130 and 140. Applicants have further calculated voltages at every node and time for operation of post driver 100 to confirm that the modeled post driver 100 does not overstress MOS core devices 110, 120, 130 and 140 and that it remains sufficiently reliable during various process corners. The calculated process corners include: (a) a typical corner, defined as typical typical, operating at 1×Vdd, and 25° C., (b) a worst case low temperature corner, defined as slow slow, 0.9×Vdd and −40° C., and (c) a maximum leakage corner, defined as fast fast, 1.1×Vdd, and 125° C.

In alternative embodiments, any threshold voltage of MOS core devices or diodes can be adopted, with the remainder of the components being adapted according to the description herein. Likewise, the disclosed embodiments may be adapted to any process core devices' maximum operating voltage, using a threshold voltage such that the maximum operating voltage plus the threshold voltage is more than the I/O voltage. In alternative embodiments, diode 155 may be replaced with a component that provides a similar voltage clamping Vth. For example, diode 155 may be replaced with a MOS transistor (not shown) having its gate and drain terminals shorted together to function similar to diode 155. Other compressed circuits may be suitable. In some embodiments, transistors 110, 120, 130 and 140 are implemented as standard threshold voltage transistors (SVT). Depending on design goals, typically leakage and speed, alternative embodiments use transistors that may be implemented using low threshold voltage transistors (LVT), high threshold voltage transistors (HVT), other available threshold levels, and combinations thereof. As will be appreciated by one of ordinary skill in the art, other embodiments may be implemented using other transistor technologies besides MOSFET.

Likewise, complimentary circuits to that shown in FIG. 1 may be developed using complimentary voltages and components. Herein Vssq and Vss rails have been described as being connected to ground. The term ground is used to encompass a common reference voltage node, and need not be connected to a true ground. In alternative embodiments, the low voltage level of the I/O voltage range and/or the core voltage range may be at some other reference voltage level, including negative voltages. One of ordinary skill in the art will appreciate that design variations may be made to meet particular speed, driving and reliability requirements for a given I/O problem, specification or design parameter.

Compared to alternative techniques, various embodiments allow I/O devices useable with a SOC or 3D IC die to be developed with reduced tapeout mask costs, fabrication times, and required circuit area. For example, implementing the post driver using core devices instead of larger components disposed off-die in traditional I/O devices results in a savings of fabrication time. Post driver 100, implemented using SVT core devices on the N28HPM presented a space saving of approximately 21% as compared to traditional I/O devices disposed off-die and operating directly using the 1.2V±5% Vddq level. Such savings are on a per I/O channel basis. Certain embodiments can reduce 4 to 5 times the tapeout mask costs. Various embodiments allow a core devices post driver useable with a SOC or 3D IC die without requiring provision of an extra middle-bias-voltage at each I/O cell, resulting in reduced required area, power and stability concerns. Porting benefits are likewise increased during process migration because core devices typically see a better shrink factor than off-die I/O devices.

Certain embodiments advantageously do not require additional electrostatic discharge ("ESD") protection devices. For example, if a new extra middle-bias-voltage were required to implement a core devices post driver, an additional ESD protection device would need to be interconnected between the middle-bias-voltage and each of the existing voltage rails, Vdd, Vss, Vddq, and Vssq, which would consequently weaken the ESD network.

In certain aspects and embodiments, a post driver, a system for using a post driver, and a method of operating a post driver are disclosed. In a first aspect, disclosed is a post driver implemented using core devices adapted to operate over a core voltage range between a high and a low voltage level. The post driver has an output connection for providing output voltages within an I/O voltage range defined between a high voltage and a low voltage, where the I/O voltage range being greater than the core voltage range. The post driver has a first power connection adapted to operate at the high voltage of the I/O voltage range and a second power connection adapted to operate at the low voltage of the I/O voltage range. The post driver has a first pair of transistors including a first and a second transistor, the transistors being core devices connected in cascade between the first power connection and the output connection and connected to each other at a first intermediate node. The post driver having a second pair of transistors including a third and a fourth transistor, the transistors being core devices connected in cascade between the output connection and the second power connection and connected to each other at a second intermediate node. The post driver further having a voltage clamping element connecting the first and second intermediate nodes and having a threshold voltage greater than the difference between the I/O voltage range and the core voltage range.

In a second aspect, disclosed is an electronic system having at least one integrated circuit silicon die. The electronic system having an off-core circuit disposed off of the integrated circuit silicon die. The system having a core circuit disposed on the integrated circuit silicon die and including a plurality of core devices adapted to operate over a core voltage range, the core circuit including a plurality of post drivers coupling the core circuit to the off core circuit and implemented using core device transistors adapted to operate over the core voltage range. At least one of the plurality of post drivers having the features described above with respect to the first aspect.

In a third aspect, disclosed is a method of operating a post driver implemented using core device transistors to drive an output connection between the high and low voltage levels of an I/O voltage range. The method includes providing a post driver having a plurality of MOS core devices adapted to operate within a high and low voltage level of a core voltage range, the core voltage range being less than the I/O voltage range. The post driver having a voltage output connection. The plurality of MOS core devices being cascaded between a first power connection and a second power connection. The post driver having a voltage clamping element with a predefined threshold voltage configured to maintain the voltage difference across the terminals of each of the MOS core devices within the core voltage range. The method further including supplying the high voltage of the I/O voltage range to the first power connection and supplying the low voltage of the I/O voltage range to the second power connection without overstressing any of the plurality of MOS core devices.

In some embodiments, the method further including the steps of applying a first input voltage to the gate terminal of a first MOS core device in the plurality of MOS core devices at a level within the high voltage of the I/O voltage range and the threshold voltage above the low voltage of the I/O voltage range. The method further including applying a second input voltage to the gate terminal of a second MOS core device in the plurality of MOS core devices at a level within the high voltage level of the core voltage range and the threshold voltage above the low voltage of the I/O voltage range. The method further including applying a third input voltage to the gate terminal of a third MOS core device in the plurality of MOS core devices at a level within the high voltage level of the core voltage range and the threshold voltage above the low voltage of the I/O voltage range. The method further including applying a fourth input voltage to the gate terminal of a fourth MOS core device in the plurality of MOS core devices at a level within the high voltage level of the core voltage range and the low voltage of the I/O voltage range.

In various embodiments, the method further including pulling down the output voltage of the post driver by driving the first, second, third and fourth input voltages to their respective high voltages.

In some embodiments, the method further including pulling up the output voltage of the post driver by driving the first, second, third and fourth input voltages to their respective low levels.

In various embodiments, the method further including turning off the post driver and placing it into a tri-state by driving the first and second input voltages to their respective high levels while driving the third and fourth input voltages to their respective low levels.

In some embodiments, the voltage clamping element includes a component having a threshold voltage characteristic of a diode. In some embodiments, the component is a MOS core device with its gate and drain terminals shorted together.

In various embodiments, the first pair of transistors is a set of PMOS core devices adapted to receive voltages at their respective gate terminals between the high voltage of the I/O voltage range and the threshold voltage above the low voltage of the I/O voltage range. In some embodiments, the electronic system is adapted to apply an input voltage to the gate terminal of a first PMOS core device in the first pair of transistors at a level within the high voltage of the I/O voltage range and the threshold voltage above the low voltage of the I/O voltage range, and to apply an input voltage to the gate terminal of a second PMOS core device in the first pair of transistors at a level within the high voltage level of the core voltage range and the threshold voltage above the low voltage of the I/O voltage range.

In various embodiments, the second pair of transistors is a set of NMOS core devices adapted to receive voltages at their respective gate terminals between the high voltage of the core operating voltage and the low voltage of the I/O voltage range. In some embodiments, the electronic system is adapted to apply an input voltage to the gate terminal of a first NMOS core device in the second pair of transistors at a level within the high voltage level of the core voltage range and the threshold voltage above the low voltage of the I/O voltage range, and to apply an input voltage to the gate terminal of a second NMOS core device in the second pair of transistors at a level within the high voltage level of the core voltage range and the low voltage of the I/O voltage range.

In some embodiments, the post driver is adapted for a wide I/O application and the high voltage of the I/O voltage range is 1.2 V plus or minus 5%.

Although the subject matter has been described in terms of exemplary embodiments, it is not limited thereto. Rather, the appended claims should be construed broadly, to include other variants and embodiments, which may be made by those skilled in the art.

What is claimed is:

1. A post driver implemented using core devices adapted to operate over a core voltage range between a high and a low voltage level, the post driver comprising:
   an output connection for providing output voltages within an I/O voltage range defined between a high voltage and a low voltage, the I/O voltage range being greater than said core voltage range;
   a first power connection adapted to operate at said high voltage of said I/O voltage range;
   a second power connection adapted to operate at said low voltage of said I/O voltage range;
   a first pair of transistors including a first and a second transistor, the transistors being core devices connected in cascade between said first power connection and said output connection and connected to each other at a first intermediate node;
   a second pair of transistors including a third and fourth transistor, the transistors being core devices connected in cascade between said output connection and said second power connection and connected to each other at a second intermediate node; and
   a voltage clamping element connecting said first and second intermediate nodes and having a threshold voltage greater than the difference between said I/O voltage range and said core voltage range.

2. The post driver of claim 1, wherein said voltage clamping element includes a component having a threshold voltage characteristic of a diode.

3. The post driver of claim 2, wherein said component is a MOS core device with its gate and drain terminals shorted together.

4. The post driver of claim 1, wherein the first pair of transistors are PMOS core devices adapted to receive voltages at their respective gate terminals between said high voltage of said I/O voltage range and said threshold voltage above said low voltage of said I/O voltage range.

5. The post driver of claim 1, wherein the second pair of transistors are NMOS core devices adapted to receive voltages at their respective gate terminals between said high voltage of said core voltage range and said low voltage of said I/O voltage range.

6. The post driver of claim 1, wherein said post driver is adapted for a wide I/O application, said high voltage of said I/O voltage range is 1.2 V plus or minus 5%.

7. An electronic system having an integrated circuit silicon die, the electronic system comprising:
- an off-core circuit disposed off of said integrated circuit silicon die;
- a core circuit disposed on said integrated circuit silicon die and comprising a plurality of core devices adapted to operate over a core voltage range, the core circuit including a plurality of post drivers coupling said core circuit to said off-core circuit and implemented using core device transistors adapted to operate over said core voltage range, at least one of said plurality of post drivers comprising:
  - an output connection for providing output voltages within an I/O voltage range defined between a high voltage and a low voltage, the I/O voltage range being greater than said core voltage range;
  - a first power connection adapted to operate at said high voltage of said I/O voltage range;
  - a second power connection adapted to operate at said low voltage of said I/O voltage range;
  - a first pair of transistors, the transistors being core devices connected in cascade between said first power connection and said output connection and connected to each other at a first intermediate node;
  - a second pair of transistors, the transistors being core devices connected in cascade between said output connection and said second power connection and connected to each other at a second intermediate node; and
  - a voltage clamping element connecting said first and second intermediate nodes and having a threshold voltage greater than the difference between said I/O voltage range and said core voltage range.

8. The electronic system of claim 7, wherein said voltage clamping element includes a component having a threshold voltage characteristic of a diode.

9. The electronic system of claim 8, wherein said component is a MOS core device with its gate and drain terminals shorted together.

10. The electronic system of claim 7, wherein the first pair of transistors are PMOS core devices and the electronic system is adapted to provide voltages at the respective gate terminals of said PMOS core devices between said high voltage of said I/O voltage range and said threshold voltage above said low voltage of said I/O voltage range.

11. The electronic system of claim 10, wherein the electronic system is adapted to apply an input voltage to the gate terminal of a first PMOS core device in said first pair of transistors at a level within said high voltage of said I/O voltage range and said threshold voltage above said low voltage of said I/O voltage range, and to apply an input voltage to the gate terminal of a second PMOS core device in said first pair of transistors at a level within said high voltage level of said core voltage range and said threshold voltage above said low voltage of said I/O voltage range.

12. The electronic system of claim 7, wherein the second pair of transistors are NMOS core devices adapted to receive voltages at their respective gate terminals between said high voltage of said core voltage range and said low voltage of said I/O voltage range.

13. The electronic system of claim 12, wherein the electronic system is adapted to apply an input voltage to the gate terminal of a first NMOS core device in said second pair of transistors at a level within said high voltage level of said core voltage range and said threshold voltage above said low voltage of said I/O voltage range, and to apply an input voltage to the gate terminal of a second NMOS core device in said second pair of transistors at a level within said high voltage level of said core voltage range and said low voltage of said I/O voltage range.

14. The electronic system of claim 7, wherein the electronic system is adapted for a wide I/O application, and said high voltage of said I/O voltage range is 1.2 V plus or minus 5%.

15. A method of operating a post driver implemented using core device transistors to drive an output connection between the high and low voltage of an I/O voltage range, the method comprising steps:
- providing said post driver comprising a plurality of MOS core devices adapted to operate within a high and low voltage level of a core voltage range, the core voltage range being less than the I/O voltage range, the post driver adapted to provide an output voltage on a voltage output connection, the plurality of MOS core devices being cascaded between a first power connection and a second power connection and having a voltage clamping element with a threshold voltage configured to maintain the voltage difference across the terminals of each of said plurality of MOS core devices within the core voltage range;
- supplying said high voltage of said I/O voltage range to said first power connection; and
- supplying said low voltage of said I/O voltage range to said second power connection without overstressing any of said plurality of MOS core devices.

16. The method of claim 15, further comprising steps:
- applying a first input voltage to the gate terminal of a first MOS core device in said plurality of MOS core devices at a level within said high voltage of said I/O voltage range and said threshold voltage above said low voltage of said I/O voltage range;
- applying a second input voltage to the gate terminal of a second MOS core device in said plurality of MOS core devices at a level within said high voltage level of said core voltage range and said threshold voltage above said low voltage of said I/O voltage range;
- applying a third input voltage to the gate terminal of a third MOS core device in said plurality of MOS core devices at a level within said high voltage level of said core voltage range and said threshold voltage above said low voltage of said I/O voltage range; and
- applying a fourth input voltage to the gate terminal of a fourth MOS core device in said plurality of MOS core devices at a level within said high voltage level of said core voltage range and said low voltage of said I/O voltage range.

17. The method of claim 16, further comprising the step of pulling down said output voltage of said post driver by driving said first, second, third and fourth input voltages to their respective high levels.

18. The method of claim 16, further comprising the step of pulling up said output voltage of said post driver by driving said first, second, third and fourth input voltages to their respective low levels.

19. The method of claim 16, further comprising the step of turning off the post driver and placing it into a tri-state by driving said first and second input voltages to their respective high levels while driving said third and fourth input voltages to their respective low levels.

* * * * *